United States Patent
Shepard et al.

(10) Patent No.: US 8,732,391 B2
(45) Date of Patent: May 20, 2014

(54) OBSOLETE BLOCK MANAGEMENT FOR DATA RETENTION IN NONVOLATILE MEMORY

(75) Inventors: Zac Shepard, San Jose, CA (US); Steven T. Sprouse, San Jose, CA (US); Chris Nga Yee Avila, Sunnyvale, CA (US); Neil David Hutchison, Campbell, CA (US)

(73) Assignee: SanDisk Technologies Inc., Plano, TX (US)

( * ) Notice: Subject to any disclaimer, the term of this patent is extended or adjusted under 35 U.S.C. 154(b) by 264 days.

(21) Appl. No.: 13/453,898

(22) Filed: Apr. 23, 2012

(65) Prior Publication Data

US 2013/0282958 A1 Oct. 24, 2013

(51) Int. Cl.
*G06F 12/00* (2006.01)
*G06F 12/02* (2006.01)

(52) U.S. Cl.
CPC .................................. *G06F 12/0238* (2013.01)
USPC ......................................................... 711/103

(58) Field of Classification Search
CPC .......................... G06F 12/0238; G06F 12/0246
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,689,467 A | 11/1997 | Hashimoto | |
| 5,768,192 A | 6/1998 | Eitan | |
| 5,903,495 A | 5/1999 | Takeuchi et al. | |
| 5,978,278 A | 11/1999 | Lee | |
| 6,011,725 A | 1/2000 | Eitan | |
| 6,046,935 A | 4/2000 | Takeuchi et al. | |
| 6,222,762 B1 | 4/2001 | Guterman et al. | |
| 6,684,173 B2* | 1/2004 | Kessenich et al. | 702/117 |
| 7,057,939 B2 | 6/2006 | Li et al. | |
| 8,040,744 B2 | 10/2011 | Gorobets et al. | |
| 8,094,500 B2 | 1/2012 | Paley et al. | |
| 2010/0174845 A1 | 7/2010 | Gorobets et al. | |
| 2010/0174846 A1 | 7/2010 | Paley et al. | |
| 2010/0174847 A1 | 7/2010 | Paley et al. | |
| 2011/0075482 A1 | 3/2011 | Shepard et al. | |
| 2012/0023144 A1* | 1/2012 | Rub | 707/813 |
| 2012/0124273 A1* | 5/2012 | Goss et al. | 711/103 |

FOREIGN PATENT DOCUMENTS

WO    WO 200830377    3/2008

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
U.S. Appl. No. 61/142,620 entitled "Balanced Performance for On-Chip Folding on Non-Volatile Memories," filed Jun. 9, 2011, 144 pages.

* cited by examiner

*Primary Examiner* — Brian Peugh
(74) *Attorney, Agent, or Firm* — Davis Wright Tremaine LLP

(57) ABSTRACT

In a nonvolatile memory array, blocks that contain only obsolete data are modified by adding charge to their cells, increasing the charge level from the programmed charge levels that represented obsolete data to elevated charge levels. The increase in overall charge in such blocks lessens the tendency of such blocks to impact data retention in neighboring blocks.

16 Claims, 13 Drawing Sheets

Programming into four states represented by a 2-bit code

Multistate Memory

Lower Page Programming (2-bit Code)

Upper Page Programming (2-bit Code)

Lower Page Read (2-bit Code)

Upper Page Read (2-bit Code)

|  Plane 0  |  Plane 1  |
|---|---|
| MLC | MLC |
| MLC | MLC |
| MLC | Obsolete |
| MLC | Obsolete |
| MLC | MLC |
| Obsolete | MLC |
| Obsolete | MLC |
| Obsolete | MLC |
| Obsolete | MLC |
| MLC | MLC |
| MLC | MLC |
| MLC | MLC |
| MLC | MLC |
| MLC | MLC |

*FIG. 9*

OBSOLETE BLOCK MANAGEMENT FOR DATA RETENTION IN NONVOLATILE MEMORY

BACKGROUND

This application relates to the operation of re-programmable non-volatile memory systems such as semiconductor flash memory, and, more specifically, to the management of blocks containing only obsolete data in such non-volatile memories.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency. These undesirable attributes make disk-based storage impractical in most mobile and portable applications. On the other hand, flash memory, both embedded and in the form of a removable card is ideally suited in the mobile and handheld environment because of its small size, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has been used interchangeably with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operations may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is to rewrite the update data in the same physical memory location. That is, the logical to physical address mapping is unchanged. However, this will mean that the entire erase block containing that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

Flash memory systems are commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In current commercial flash memory systems, the size of the erase unit has been increased to a block of enough memory cells to store multiple sectors of data. Indeed, many pages of data are stored in one block, and a page may store multiple sectors of data. Further, two or more blocks are often operated together as metablocks, and the pages of such blocks logically linked together as metapages. A page or metapage of data are written and read together, which can include many sectors of data, thus increasing the parallelism of the operation. Along with such large capacity operating units the challenge is to operate them efficiently.

For ease of explanation, unless otherwise specified, it is intended that the term "block" as used herein refer to either the block unit of erase or a multiple block "metablock," depending upon whether metablocks are being used in a specific system. Similarly, reference to a "page" herein may refer to a unit of programming within a single block or a "metapage" within a metablock, depending upon the system configuration.

In some memory systems, problems may occur in relation to the retention of data after it has been programmed into a memory array. Several mechanisms may cause data to be incorrectly read or unreadable after a period of storage in the memory array. Even where the memory system is not exposed to any severe or unusual influences, data retention may be less than ideal. In general, data retention has become worse as critical dimensions of memory arrays have become smaller.

There is a general need for a memory system that maintains high data retention even as critical dimensions of memory cells become smaller.

SUMMARY OF THE INVENTION

According to an aspect of the present invention, blocks containing only obsolete data that may affect neighboring blocks are identified in a memory array. These blocks are then subject to a process that adds charge to their memory cells to raise them to elevated charge levels that are higher than their programmed charge levels. This process does not program the cells to memory states that correspond to any received data, but rather raises cells to charge levels that are not intended to correspond to any particular memory state, and thus may be performed rapidly, without verification that cells have achieved particular memory states. The addition of charge reduces or eliminates the tendency of some blocks (e.g. partially programmed blocks, binary, or other blocks with lower charge density than neighboring blocks) to affect data retention in neighboring blocks, especially MLC blocks.

An example of a method of managing erase blocks containing only obsolete data in a block-erasable floating gate memory array may include: identifying an erase block of the block-erasable memory array as containing only obsolete data, the obsolete data stored as programmed charge levels in floating gates of the erase block; and in response to identifying the erase block as containing only obsolete data, charging the floating gates of the erase block from the programmed charge levels to elevated charge levels.

The erase blocks may be maintained with floating gates at the elevated charge levels until a predetermined condition is met. The predetermined condition may be the receipt of new data to be written to the erase block. The elevated charge levels may not represent any data received by the memory array. The charging may consist of a single programming pulse without verification. The erase block may be additionally identified as being in a low-charge condition prior to the charging. The low-charge condition may be one of: (a) containing only data stored in one-bit per cell form, (b) containing only lower-page MLC data, or (c) containing a significant unwritten area.

An example of a method of managing erase blocks in a block-erasable floating gate nonvolatile memory array may include: determining if an erase block in the floating gate nonvolatile memory array contains only obsolete data; subsequently, without any intervening erase operation, adding charge to floating gates of the cells of the erase block that contains only obsolete data; maintaining the erase block with the added charge until a predetermined condition is met; and in response to meeting the predetermined condition, erasing the erase block.

Erasing the block may occur immediately prior to programming new data to the block. The method may also include determining that the erase block is in a low-charge condition prior to the adding charge. The low-charge condition may be a condition in which the block contains less than a threshold amount of data. The low-charge condition may be a condition in which the block contains only cells that are in lower charge states of a plurality of charge states used to represent data in the memory array.

An example of a block-erasable floating gate nonvolatile memory may include: a plurality of erase blocks, an individual erase block of the plurality of erase blocks consisting of a plurality of floating gate nonvolatile memory cells that are erasable together as a minimum unit of erase; and a memory manager that manages the plurality of erase blocks such that an erase block containing only obsolete data is subject to a charging process that charges individual floating gates of cells in the erase block from charge levels representing obsolete data to higher charge-levels.

Erase blocks that were subject to the charging process may be subsequently maintained with floating gates at the higher charge levels. The erase blocks may be maintained at the higher charge levels until they are assigned for storage of data. The erase blocks that are maintained with floating gates at the higher charge levels may subsequently be erased when they are assigned for storage of data.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 9 illustrates a memory containing obsolete data in blocks that are potential aggressor blocks.

DETAILED DESCRIPTION

Memory System

Figure 1:
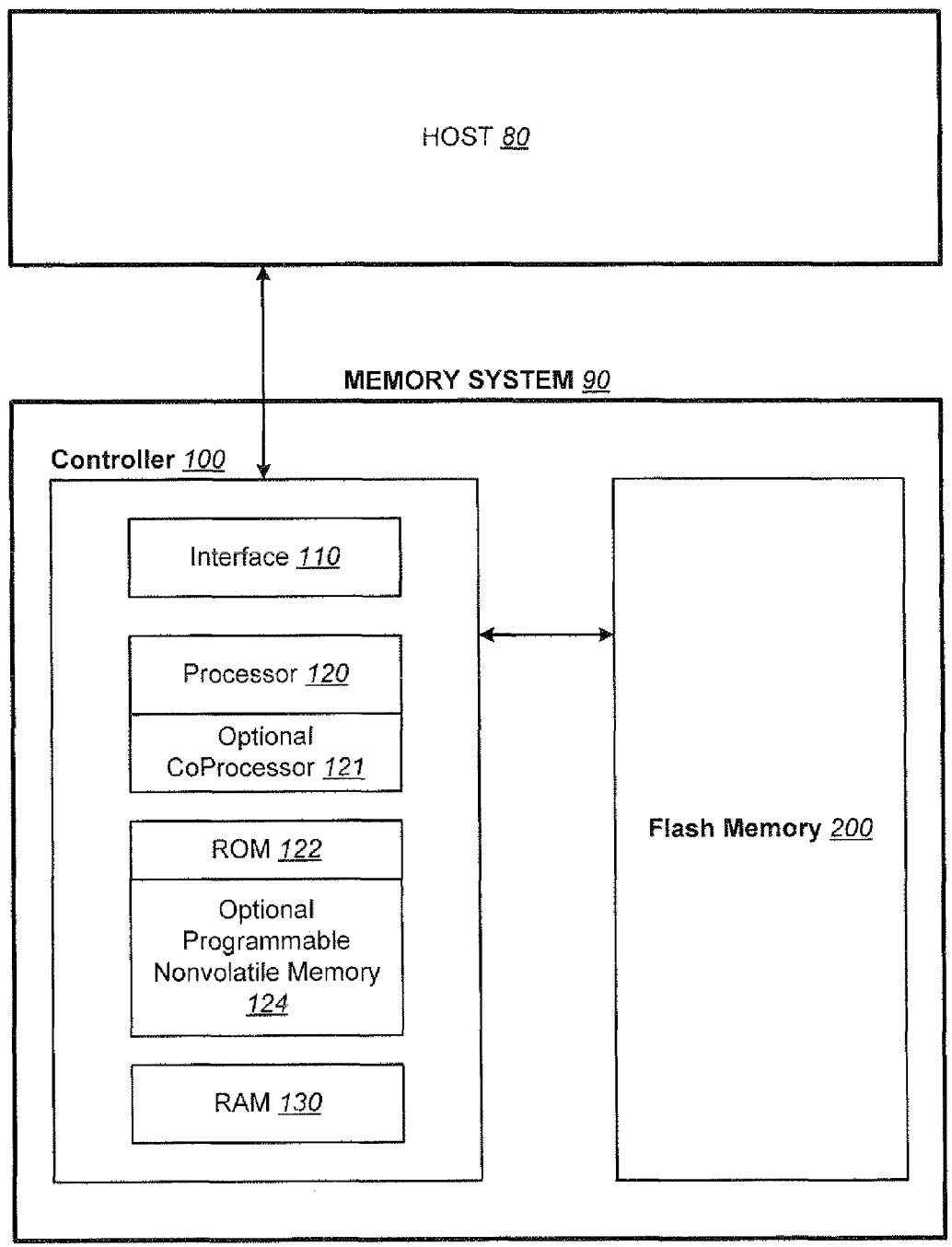
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
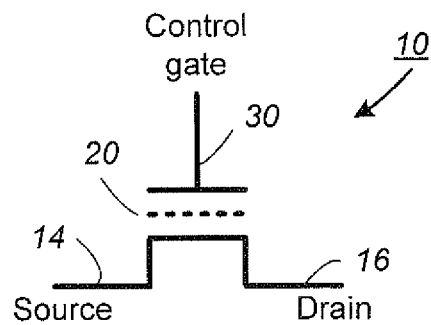
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
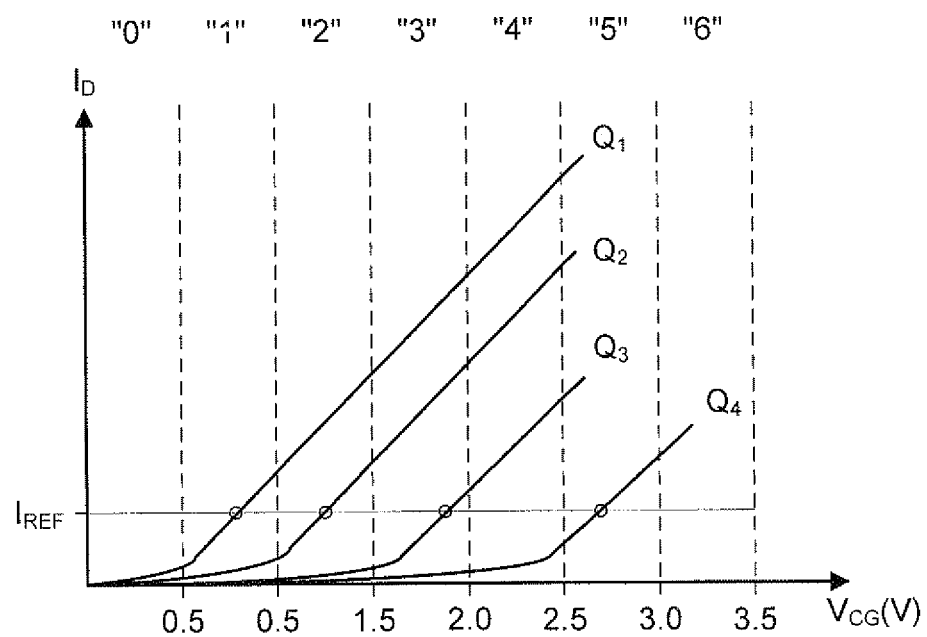
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
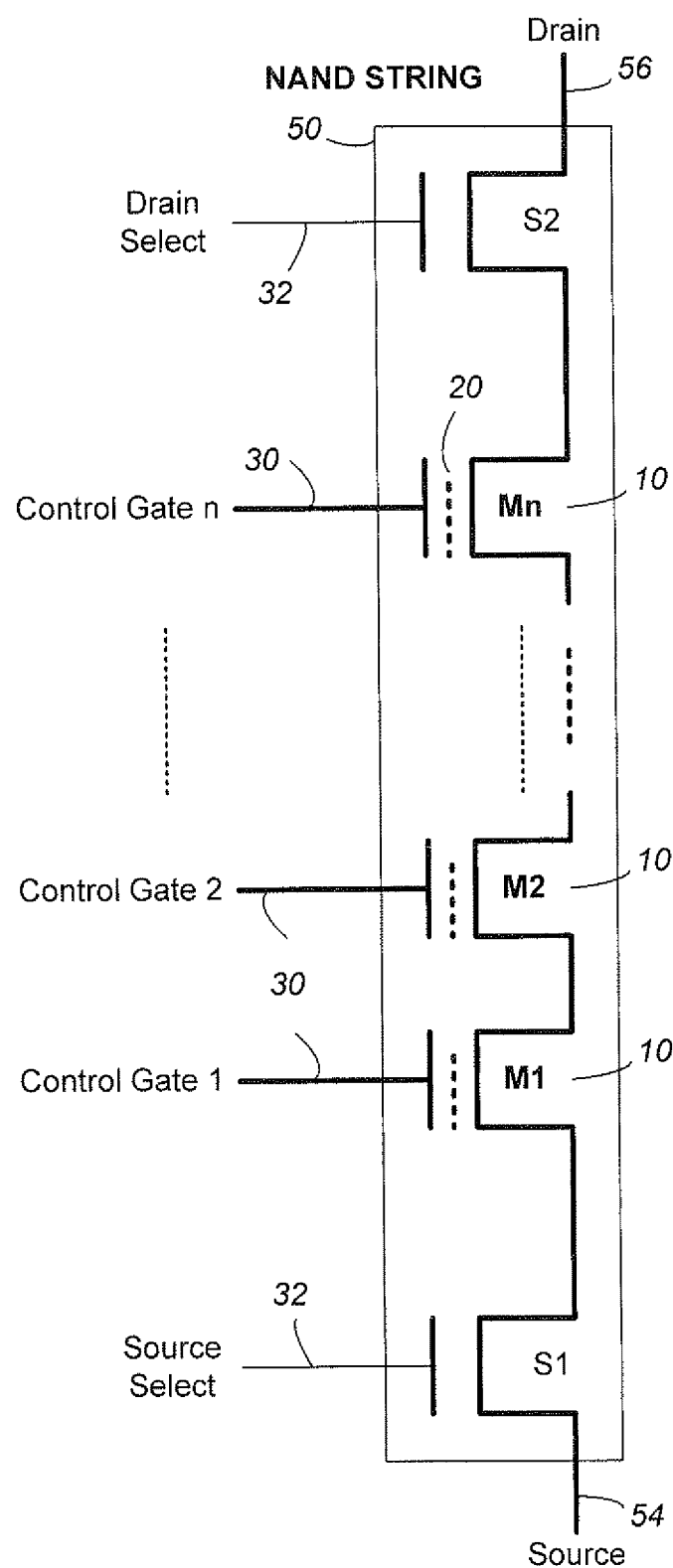
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
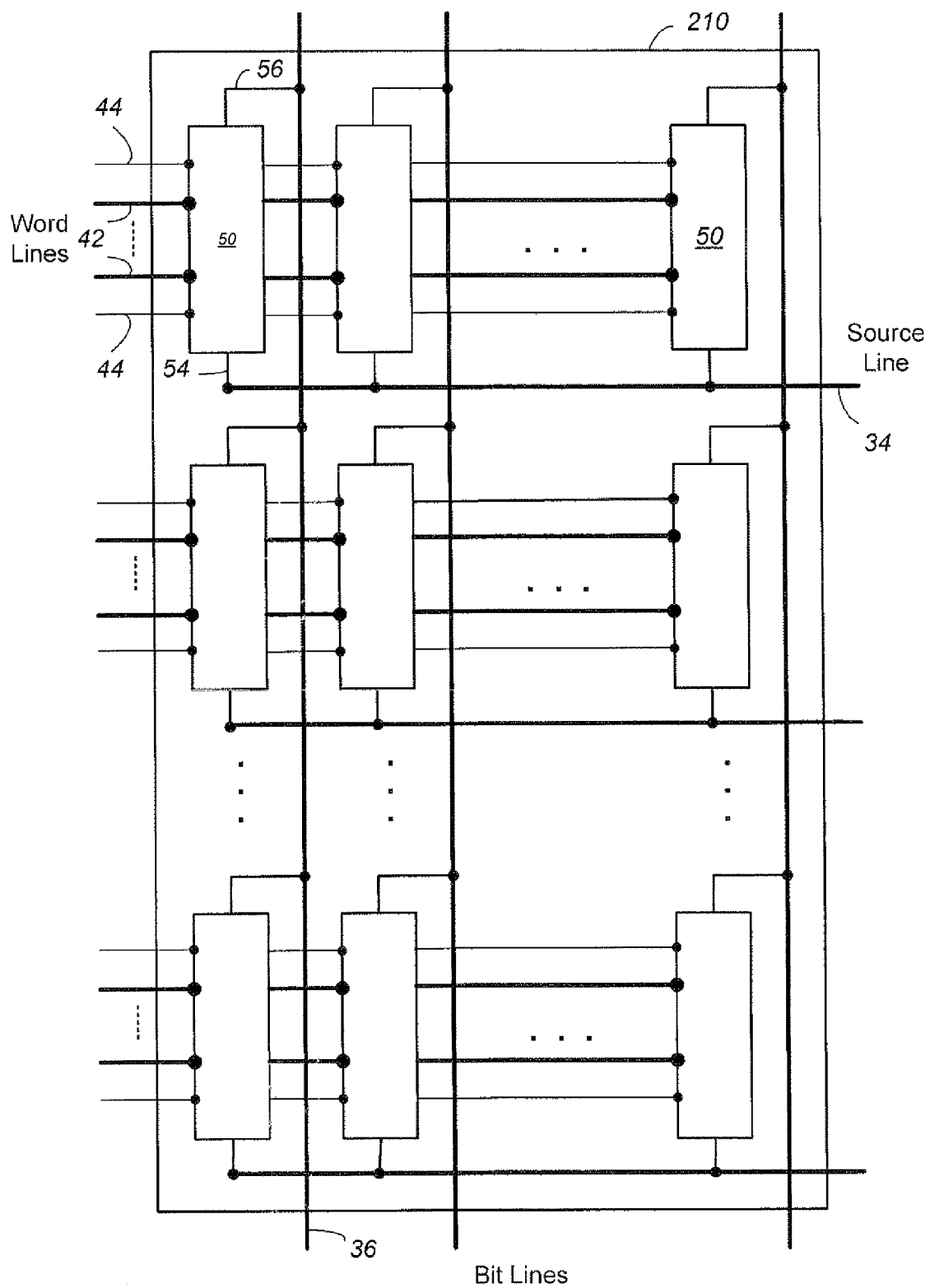
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
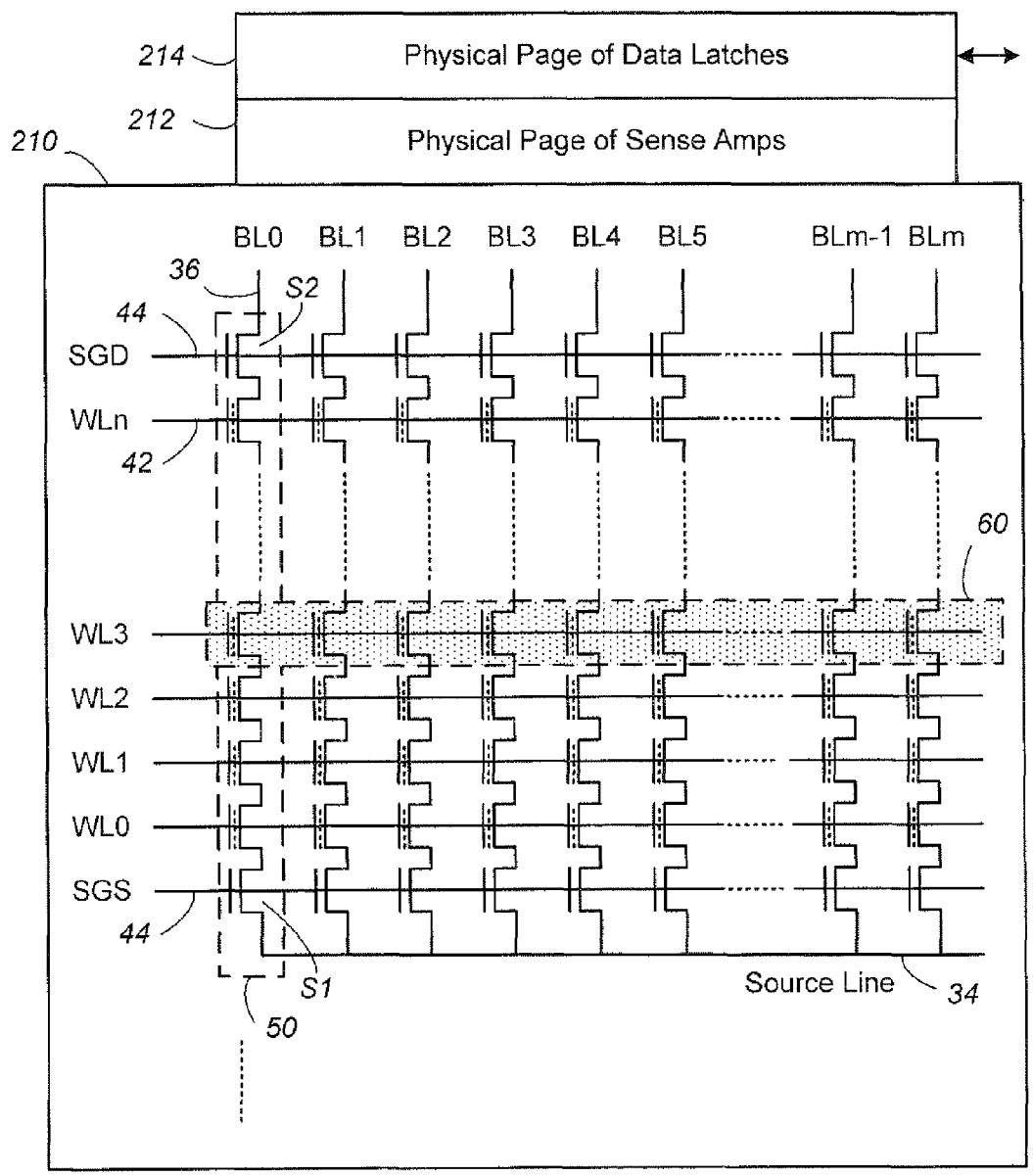
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the hit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-level Cell ("MLC") Memory Partitioning

A nonvolatile memory in which each memory cell stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-bit, Full-Sequence MLC Programming

Figure 6:
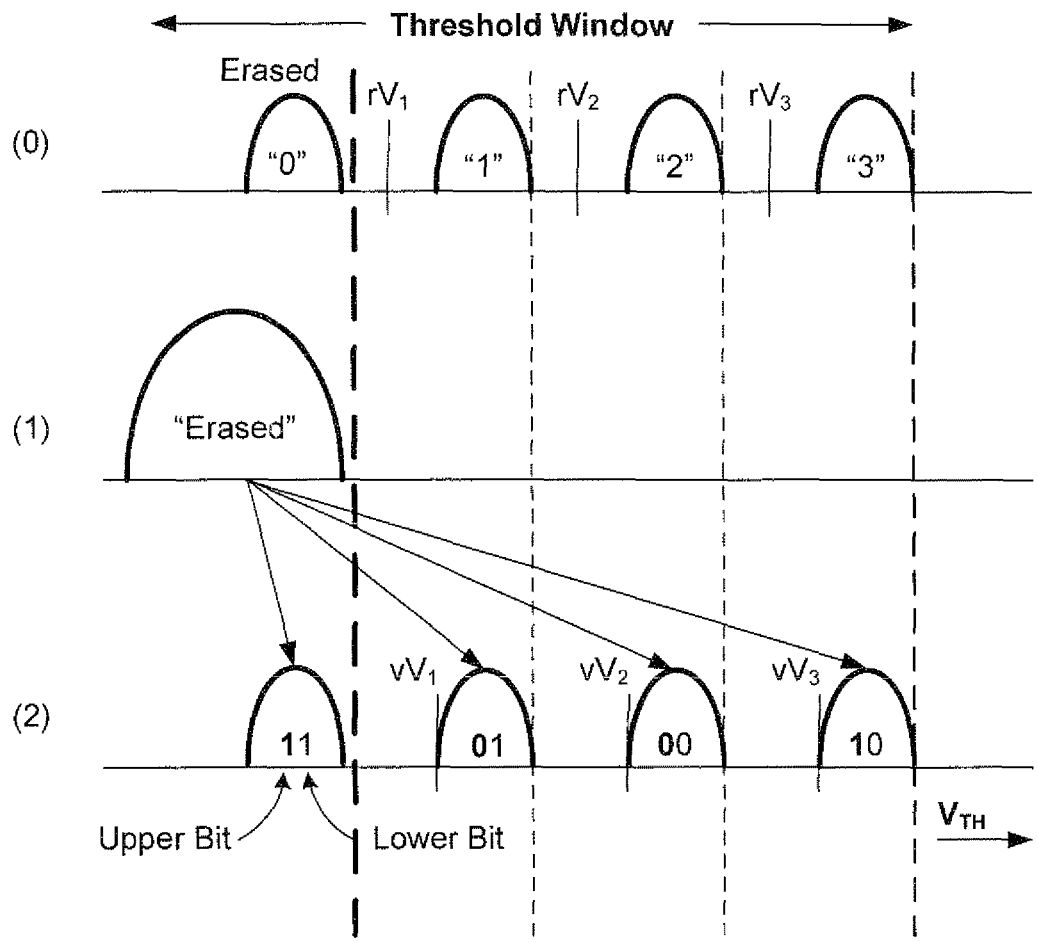
FIGS. 6(0)-6(2) illustrate an example of programming a population of 4-state memory cells.

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
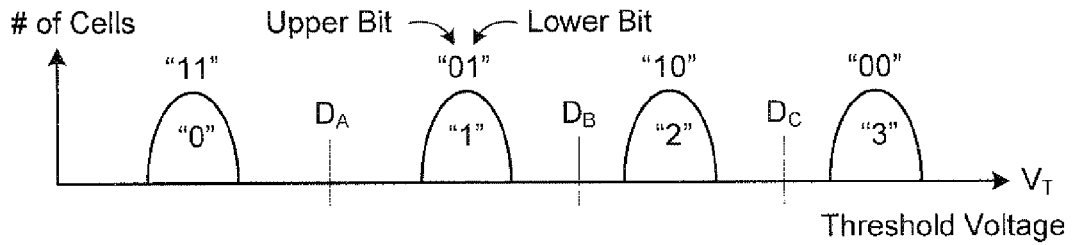
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY".

Figure 7B:
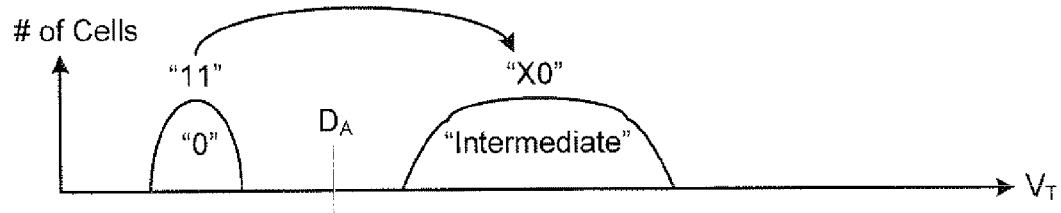

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$. A cell that has been subject to only this programming, and thus is in state (x, 0) may be considered to be in the Lower Mode "LM" state.

Figure 7C:
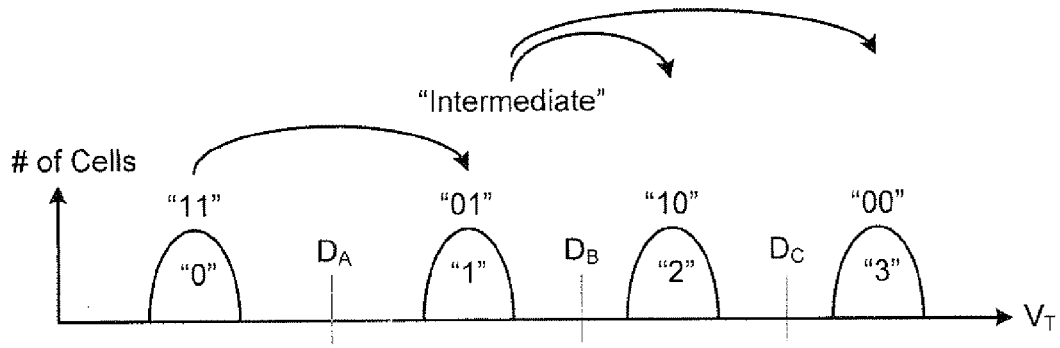

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
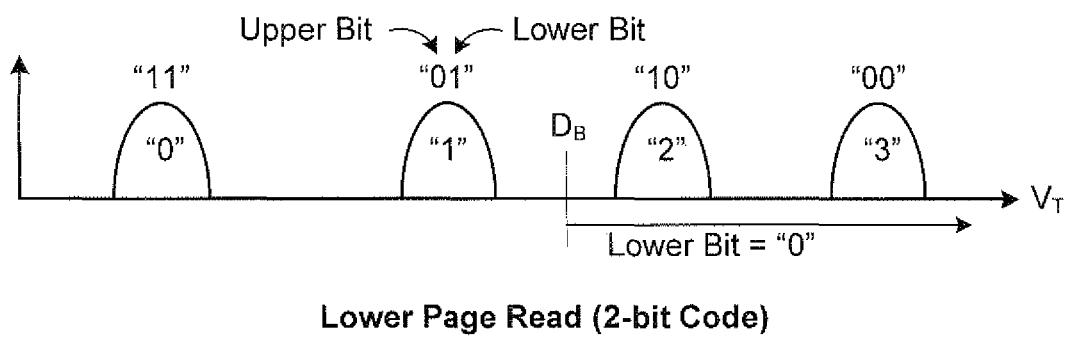

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
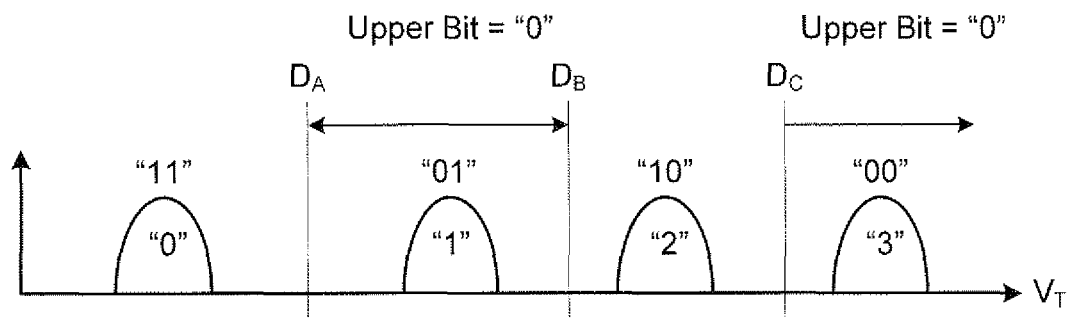

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution for programming and reading will necessarily become finer. Two issues arise as the memory cell is configured to store more bits.

First, programming or reading will be slower when the threshold of a cell must be more accurately programmed or read. In fact, in practice the sensing time (needed in programming and reading) tends to increase as the square of the number of partitioning levels.

Secondly, flash memory has an endurance problem as it ages with use. When a cell is repeatedly programmed and erased, charge is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. However it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique may be compromised by partial-page programming. A page is a group of memory cells, typically along a row or word line, that is programmed together as a unit. It is possible to program non overlapping portions of a page individually over multiple programming passes. However, because not all cells of the page are programmed in a final pass together, it may create large difference in charges programmed among the cells after the page is done. Thus partial-page programming may result in more program disturb and may require a larger margin for sensing accuracy.

In the case the memory is configured to support binary data storage, the margin of operation is wider than that of MLC. In one example, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

Figure 8:
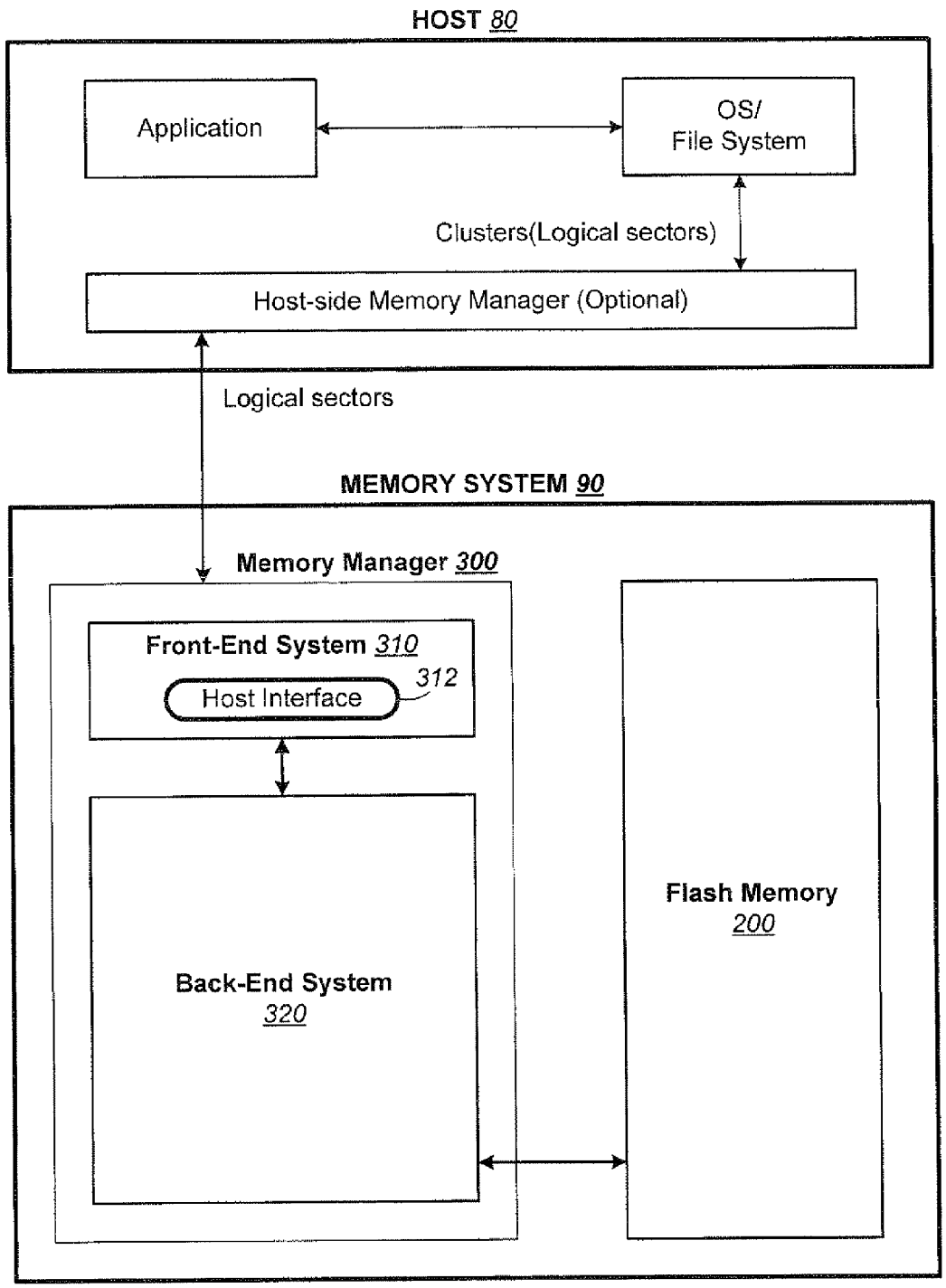
FIG. 8 illustrates the memory being managed by a memory manager which is a software component that resides in the controller.

FIG. 8 illustrates a memory being managed by a memory manager which is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in units of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Memories Having Multi-Level and Binary Portions

Memory Partitioned into Main and Binary Cache Portions

A number of memory system arrangements where the non-volatile memory includes both binary and multi-level sections will now be described. In a first of these, in a flash memory having an array of memory cells that are organized into a plurality of blocks, the cells in each block being erased together, the flash memory is partitioned into at least two portions. A first portion forms the main memory for storing mainly user data. Individual memory cells in the main memory being configured to store one or more bits of data in each cell. A second portion forms a cache for data to be written to the main memory. The memory cells in the cache portion are configured to store fewer bits of data in each cell than that of the main memory. Both the cache portion and the main memory portion operate under a block management system for which cache operation is optimized. A more detailed presentation of this material is developed in the following US patent application or provisional application Ser. Nos. 12/348,819; 12/348,825; 12/348,891; 12/348,895; 12/348,899; and 61/142,620, all filed on Jan. 5, 2009.

In one example, individual cells in the cache portion are each configured to store one bit of data while the cells in the main memory portion each stores more than one bit of data. The cache portion then operates as a binary cache with faster and more robust write and read performances.

In one example, the cache portion is configured to allow finer granularity of writes than that for the main memory portion. The finer granularity is more compatible with the granularity of logical data units from a host write. Due to requirement to store sequentially the logical data units in the blocks of the main memory, smaller and chaotic fragments of logical units from a series of host writes can be buffered in the cache portion and later reassembled in sequential order in the blocks in the main memory portion.

In one example, the decision for the block management system to write data directly to the main portion or to the cache portion depends on a number of predefined conditions. The predefined conditions include the attributes and characteristics of the data to be written, the state of the blocks in the main memory portion and the state of the blocks in the cache portion.

The Binary Cache of the present system has the follows features and advantages: a) it increases burst write speed to the device; b) it allows data that is not aligned to pages or meta-pages to be efficiently written; c) it accumulates data for a logical group, to minimize the amount of data that must be relocated during garbage collection of a meta-block after the data has been archived to the meta-block; d) it stores data for a logical group in which frequent repeated writes occur, to avoid writing data for this logical group to the meta-block; and e) it buffers host data, to allow garbage collection of the meta-block to be distributed amongst multiple host busy periods.

Data Retention

In an ideal nonvolatile memory, once data is stored in a memory array that data remains unchanged, and available to be read at any time thereafter. However, in real memories, some changes may occur in such stored data over time. These changes may cause data to be misread at a later time. While ECC may be able to detect and correct some errors, this incurs some overhead, and ECC can only correct a limited number of errors. If this limit is exceeded the data is uncorrectable. Some of the changes in stored data may occur because of physical defects in the memory array, or because of the effects of wear on the memory cells. However, even in memories that do not suffer from physical defects or significant wear, it has been found that data retention may be significantly reduced by certain physical arrangements of data in a memory array.

Data retention may be degraded in programmed areas of a floating gate memory array that are adjacent to erased blocks, in particular during surface mounting, or other processing that may subject memory chips to elevated temperatures, due to a phenomenon known as "global charge effect". Examples of such data retention problems and their solutions are discussed in U.S. Patent Application Publication Number 2011/0075482, to Shepard et al (publication date Mar. 31, 2011). Specifically, a solution is described in which erased blocks are programmed to higher threshold voltages prior to surface mounting. Then, after surface mounting, the previously erased blocks are returned to the erased state.

It has been found that data retention may also be degraded in areas of a floating gate memory array that are programmed using a data storage format that results in relatively high charge levels when such areas are adjacent to areas of the memory array that are programmed using a data storage format that results in relatively low charge levels. Such degradation is not always limited to surface mounting or other high temperature processing (though it may be exacerbated by higher temperatures). In particular, data that is programmed in MLC format may be susceptible to data retention problems where surrounding portions of the memory array are not fully programmed with data in MLC format. For example, erased blocks, blocks containing only binary data or lower page MLC data, or blocks that are only partially filled may act as "aggressor blocks" that may affect data retention in neighboring MLC blocks.

The number of erased blocks may be kept low by using an erase-before-write scheme in which erase blocks containing obsolete data are not erased as soon as they are found to contain only obsolete data. Instead, they are maintained in their written state (containing obsolete data) until they are needed for writing new data. Then, they are erased and immediately written. This avoids maintaining an erased block pool and thus avoids the problem of erase blocks acting as aggressor blocks in the memory. However, while maintaining obsolete data in this way may be preferable to having a large number of erased blocks in the memory, obsolete data may also cause data retention problems. In particular, where blocks of obsolete data contain binary or lower-mode data, or are only partially filled, they may act as aggressor blocks that tend to draw charge from adjacent MLC blocks.

The difference in charge levels between binary or lower-mode data and MLC data may be seen from comparing FIGS. 7B and 7C. A block that contains only binary or lower-mode data will contain less charge than if it was programmed with MLC data (i.e. less charge than if it was additionally programmed with upper page data). The aggregate effect of a block, or several blocks, containing only binary or lower-mode data may cause some charge loss in more highly charged cells of adjacent MLC blocks. Similarly, unfilled blocks (blocks with additional unwritten capacity) contain a significant number of cells in the erased state and may also affect neighboring MLC blocks. It will be understood that the effects of low charge blocks depend on the level of charge (e.g. how much unwritten space there is in the block), on the physical arrangement of such blocks (greater effect when they are clustered together), and on the geometry of the memory array (smaller dimensions increasing effect on neighboring blocks). In some memories, only groups of more than a certain number of low charge blocks cause problems, while in other memories (e.g. with smaller critical dimensions) a single low charge block may cause problems.

According to aspects of the present invention, obsolete blocks that are identified as potential aggressor blocks may be subject to a charging operation that adds charge to memory cells and thus raises their charge levels from their programmed charge levels to some elevated charge levels that are higher than the levels to which they were originally programmed. The elevated charge levels are chosen to neutralize the effects on adjacent MLC blocks. That is, the elevated charge levels are chosen to provide a charge density in obsolete blocks that is similar to the charge density of fully programmed MLC blocks so that charge does not tend to migrate from the MLC blocks towards the obsolete blocks.

FIG. 9 shows two planes of a memory array (plane 0 and plane 1) containing mostly MLC data. There are also some blocks containing obsolete data that have been identified as potential aggressor blocks. For example, four blocks of plane 0 that contain obsolete data (marked "Obsolete") act as an aggressor block because they contain binary data, only lower-mode data, or are only partially written. Because they are located in a contiguous grouping they are more damaging than if they were more dispersed. They reduce data retention in four MLC blocks on either side of them in plane 0 (shown as shaded MLC blocks). In contrast, the two obsolete blocks in plane 1 may be in a similar condition (i.e. they also contain binary data, only lower-mode data, or are partially filled), but because there are only two such blocks together in plane 1, their combined effect is insufficient to cause any data retention problems in adjacent blocks and thus these blocks are not potential aggressor blocks. Aggressor blocks in one plane do not affect blocks in adjacent planes in this memory system because planes are isolated by being formed in separate wells. Thus, blocks in plane 1 are unaffected by aggressor blocks in plane 0. However, in other memory systems, the effects of aggressor blocks may not be limited in this way and the present disclosure is not limited to a particular memory arrangement. According to some embodiments, obsolete blocks that are identified as potential aggressor blocks, such as the four blocks of plane 0 are subjected to a charging operation that is similar to programming, and this raises the charge levels in their cells so that their effects on neighboring blocks is reduced or eliminated.

Figure 10:
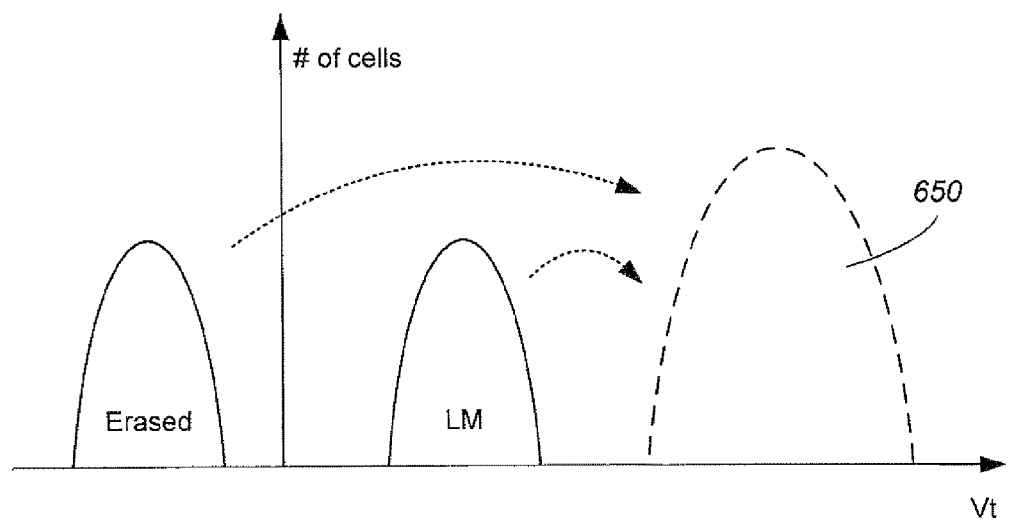
FIG. 10 shows a charging operation applied to lower-mode or binary data.

FIG. 10 shows an example of how memory cells of a block containing binary, or lower-mode data, may be charged to elevated charge levels. The cells are initially filled with obsolete data that is represented by cells in either the erased state or LM state, corresponding to a 1 or 0 as shown in FIG. 7B. After it is determined that the block is obsolete, and is a potential aggressor block, the block is subjected to an additional charging operation that adds charge to the memory cells and thus raises their charge levels to elevated charge levels. The new distribution 650 of the cells' threshold voltages (Vt) is shown by the dashed line. It should be noted that the elevated charge levels corresponding to the higher threshold voltages indicated by the distribution on the right do not correspond to any particular data. Even if the cells that have been subjected to the charging operation were later read; the results would that indicate all cells to be in the LM state (i.e. threshold voltage greater than a discrimination voltage between "erased" and "LM" states). These results do not correspond to any data received by the memory system.

Figure 11:
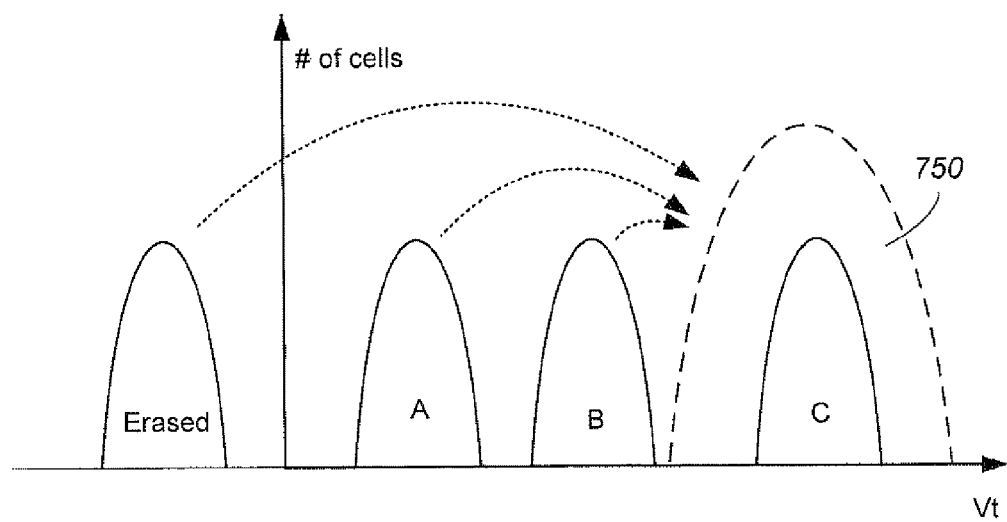
FIG. 11 shows a charging operation applied to MLC data.

FIG. 11 shows a similar charging operation on a block of MLC cells. Here, the MLC cells are initially filled with charge at four different levels, providing four different threshold voltages (Vt) corresponding to four different memory states. The charging operation increases the charge stored by cells that initially stored lower amounts of charge (e.g. "erased", A, or B). This results in a distribution of cells 750 shown by the dashed line which overlaps the highest memory state illustrated by distribution C. While cells that were previously in memory state C may have little charge added by the charging operation, it is not necessary that every cell in the block be charged by the operation, only that the aggregate charge in the block be increased. While this example relates to D2 memory, it will be understood that similar charging operations may be performed on memory cells in D3, D4 or other memories to bring their cells to a higher charge level than their programmed charge level.

It will be understood that where an MLC block is only partially written, there are a large number of cells in the erased state. Charging such cells to the elevated charge level indicated by the dashed lines in FIG. 10 or FIG. 11 raises the aggregate charge in the partially written block.

The charging operation to raise memory cells to elevated charge levels may performed in any suitable way. Because no particular memory state is desired there is generally no need for any verification step as is commonly performed when data is being programmed. Instead, all cells may be subject to a similar operation and any variation in resulting charge levels (and threshold voltages) from cell to cell may be ignored. As long as the aggregate charge level of the block in question is raised to an appropriate level, cell-to-cell variations may be ignored.

Charge may be added to memory cells in a similar manner to the programming of data, i.e. by one or more programming pulses. According to one example, a single programming pulse may be used for simplicity. For example, in some examples, a single 150 is pulse applied to all word lines in a block may be sufficient to raise the charge levels of the cells in a block to appropriate levels. In some memories there may be a command available to program all memory cells of a block together in a simple way (for example, for test purposes, such commands are sometimes provided to cycle memory cells through repeated write and erase cycles). Such a command, sometimes referred to as a "Flash Write" command, may be used to charge obsolete blocks that are potential aggressor blocks.

It will be understood that the application of a charging operation as described above results in a block from which no programmed data may be read. That is, all memory cells will generally be read as being in the highest state (highest charge level, and highest threshold voltage). Thus, even if a read operation were performed, the data obtained would not correspond to any data received by the memory system. It will also be understood that the charging operation destroys the data previously stored in the memory cells by adding charge to the memory cells and thus moving cells from their programmed levels. However, where the data that is stored in a block is determined to be obsolete there is no reason to preserve the data and so additional charging is acceptable.

In other examples of charging operations, dummy data may be programmed to the cells of an obsolete block. For example, some or all cells may be programmed to the highest memory state. This charging operation may use a series of pulse and verify steps as in conventional programming.

While the examples above refer to obsolete blocks (i.e. blocks containing only obsolete data) in some embodiments charging operations may be performed on units other than blocks in a memory array. For example, a page containing only obsolete data could be subject to a charging operation even if other portions of the block containing the page (which could still hold valid data) were not subject to a charging operation. In another example, two or more blocks could be subject to a charging operation together. In a particular memory system it may be determined that only groupings of at least X (where X may be some number of two, or more) blocks cause data retention problems. In such a memory, a grouping of X blocks may be subject to a charging operation in parallel so that effectively the unit of charging operations is X blocks. A block, or a grouping of fewer than X blocks, may not be subject to a charging operation.

A determination of whether a block is a potential aggressor block depends on several factors. The amount of unused space in a block is one factor. A memory system may determine how much data is stored in a block when it becomes obsolete. If the amount of (obsolete) data is less than a threshold amount then the block may be considered a potential aggressor and may be subject to a charging operation. The threshold amount may depend on the geometry of the memory array. For example, in some memory systems the threshold may be 90% of the block's capacity, while in another memory system it may be 50% of the block's capacity.

Figure 12:
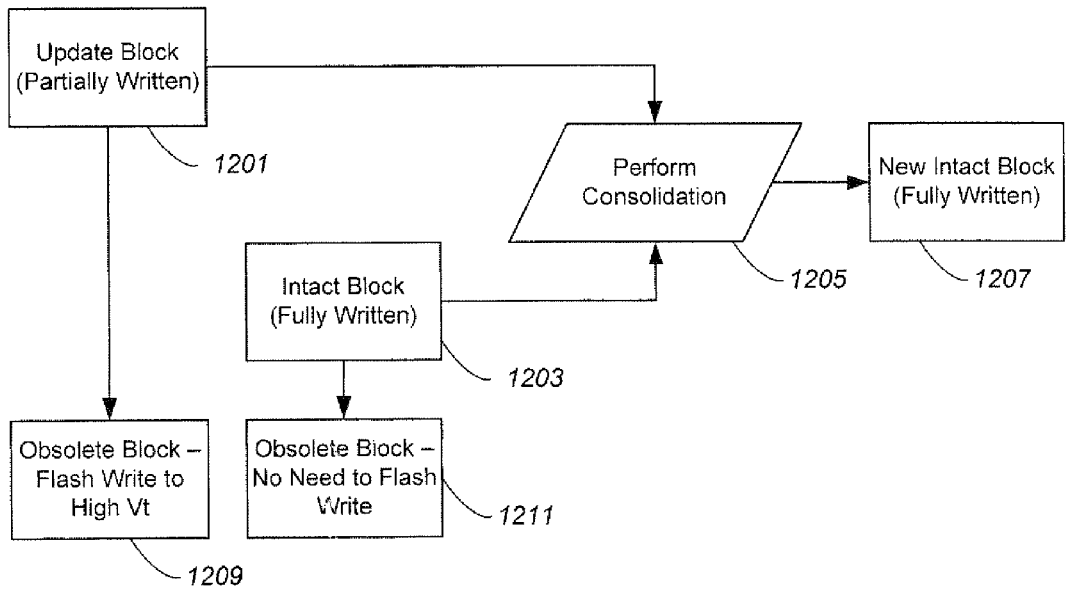
FIG. 12 shows a consolidation triggering a charging operation.

FIG. 12 shows an example of an event that may trigger a charging operation ("Flash Write to high Vt"). In some memories, a certain number of update blocks are maintained 1201 for updated data that corresponds to data that is already written in an intact block in the memory 1203. When the intact block becomes full (fully written) the update block is consolidated 1205 with the intact block, a new intact block is created 1207, and both the update block and the old intact block become obsolete. The update block is only partially written because it contains updated data corresponding to some, but not all, of the data in the intact block. Because it is only partially written, the update block is a potential aggressor block. Therefore a charging operation is performed using a Flash Write command to add charge to memory cells and thus raise Vt 1209. In contrast, the intact block is fully programmed with data. So even though the intact block is obsolete, there is no reason to perform a charging operation on it 1211.

Figure 13:
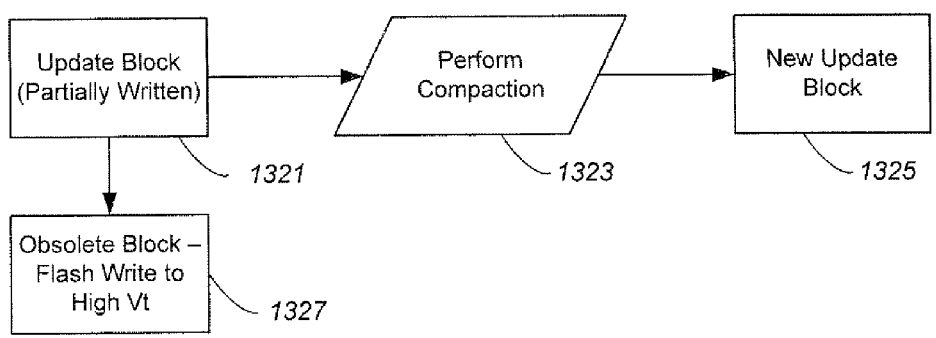
FIG. 13 shows a compaction triggering a charging operation.

FIG. 13 shows another example of an event that may trigger a charging operation. Here an update block that is partially written 1321 undergoes a compaction operation 1323 that results in a new update block 1325. The partially written update block becomes obsolete when the new update block is created. Because the obsolete update block is only partially written it is a potential aggressor block and is subject to a charging operation to raise Vt 1327.

Figure 14:
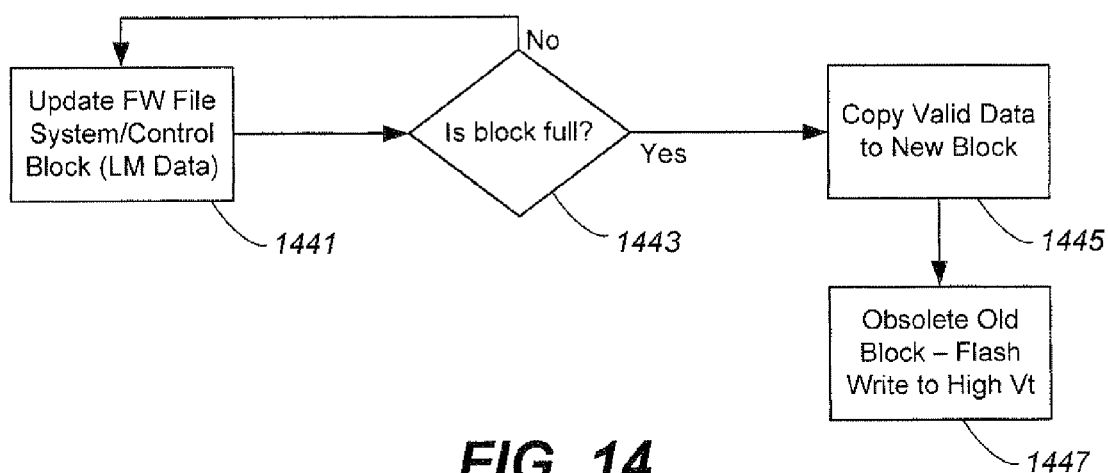
FIG. 14 shows a block becoming full triggering a charging operation.

FIG. 14 shows another example of an event that may trigger a charging operation. Here a block that contains only binary or lower-mode (LM) data is written 1441 until it is determined that the block is full 1443. When it is full, the valid data in the block is copied to a new block 1445. This makes the data in the old block obsolete. Because this obsolete data is in lower-mode, the block is a potential aggressor block. Therefore, the block is subjected to a charging process to raise Vt 1447.

After a charging operation, a block is generally maintained with its cells at elevated charge levels until the block is needed to store new valid data. Only then is the block erased, and immediately after it is erased the block is written with new data. Thus, a substantial number of blocks may be maintained with memory cells at elevated charge levels at any one time. This is in contrast to prior memory systems which generally either erased such blocks and maintained them in the erased state, or maintained them as they were programmed, even if they were partially filled, or contained binary, or lower-mode data. In either case, such blocks were generally maintained in a condition that made them potential aggressor blocks.

The present invention may be combined with other techniques to improve data retention. For example, blocks that contain only obsolete data may be maintained with obsolete data until they are needed for writing new data, at which point they are erased. Such an erase-before-write scheme reduces the number of erased blocks in the memory array at any time by deferring erase operations until immediately prior to writing new data. (This is in contrast to schemes that erase blocks soon after they are found to contain only obsolete data, and then maintains the erased blocks in an erased block pool that may represent a significant portion of the blocks of the memory array.) A separation scheme may be used with the techniques described in US Patent Publication No. 2011/0075482 so that the effects of both erased blocks and binary cache blocks (or other low charge formats) on data retention are limited.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of managing erase blocks containing only obsolete data in a block-erasable floating gate memory array comprising:
   identifying an erase block of the block-erasable memory array as containing only obsolete data, the obsolete data stored as programmed charge levels in floating gates of the erase block; and
   in response to identifying the erase block as containing only obsolete data, charging the floating gates of the erase block from the programmed charge levels to elevated charge levels.

2. The method of claim 1 further comprising: subsequently maintaining the erase block with floating gates at the elevated charge levels until a predetermined condition is met.

3. The method of claim 2 wherein the predetermined condition is the receipt of new data to be written to the erase block.

4. The method of claim 1 wherein the elevated charge levels do not represent any data received by the memory array.

5. The method of claim 1 wherein the charging consists of a single programming pulse without verification.

6. The method of claim 1 wherein the erase block is additionally identified as being in a low-charge condition prior to the charging.

7. The method of claim 6 wherein the low-charge condition is one of: (a) containing only data stored in one-bit per cell form, (b) containing only lower-page MLC data, or (c) containing a significant unwritten area.

8. A method of managing erase blocks in a block-erasable floating gate nonvolatile memory array comprising:
   determining if an erase block in the floating gate nonvolatile memory array contains only obsolete data;
   subsequently, without any intervening erase operation, adding charge to floating gates of the cells of the erase block that contains only obsolete data;
   maintaining the erase block with the added charge until a predetermined condition is met; and
   in response to meeting the predetermined condition, erasing the erase block.

9. The method of claim 8 wherein the erasing the block occurs immediately prior to programming new data to the block.

10. The method of claim 8 further comprising determining that the erase block is in a low-charge condition prior to the adding charge.

11. The method of claim 10 wherein the low-charge condition is: containing less than a threshold amount of data.

12. The method of claim 10 wherein the low-charge condition is: containing only cells that are in lower charge states of a plurality of charge states used to represent data in the memory array.

13. A block-erasable floating gate nonvolatile memory comprising:
   a plurality of erase blocks, an individual erase block of the plurality of erase blocks consisting of a plurality of floating gate nonvolatile memory cells that are erasable together as a minimum unit of erase; and
   a memory manager that manages the plurality of erase blocks such that an erase block containing only obsolete data is subject to a charging process that charges individual floating gates of cells in the erase block from charge levels representing obsolete data to higher charge-levels.

14. The block-erasable floating gate nonvolatile memory of claim 13 wherein all erase blocks that were subject to the charging process are subsequently maintained with floating gates at the higher charge levels.

15. The block-erasable floating gate nonvolatile memory of claim 14 wherein the erase blocks are maintained at the higher charge levels until they are assigned for storage of data.

16. The block-erasable floating gate nonvolatile memory of claim 15 wherein the erase blocks that are maintained with floating gates at the higher charge levels are subsequently erased when they are assigned for storage of data.

* * * * *